United States Patent [19]

Curtis, III

[11] Patent Number: 4,613,783
[45] Date of Patent: Sep. 23, 1986

[54] ELECTRONIC OSCILLATOR CRYSTAL WAFER MOUNT ASSEMBLY

[75] Inventor: Hazen Curtis, III, Andover, Mass.

[73] Assignee: AT&T Bell Laboratories, Murray Hill, N.J.

[21] Appl. No.: 756,331

[22] Filed: Jul. 18, 1985

[51] Int. Cl.⁴ ........................................... H01L 41/08
[52] U.S. Cl. .................................... 310/353; 310/326; 310/346
[58] Field of Search ............... 310/348, 326, 351–356, 310/346

[56] References Cited

U.S. PATENT DOCUMENTS

| | | | |
|---|---|---|---|
| 3,796,968 | 3/1974 | Luscher | 310/353 |
| 3,828,210 | 8/1974 | Livenick et al. | 310/351 X |
| 4,329,613 | 5/1982 | Kinzel et al. | 310/353 X |

Primary Examiner—Mark O. Budd
Attorney, Agent, or Firm—Volker R. Ulbrich

[57] ABSTRACT

An electronic oscillator wafer crystal (42, 54) mounting assembly (10, 48) includes an insulating thermoplastic mounting block (12) with top and bottom faces (16, 18). Three terminals (22, 50), radially spaced at 90 degrees with respect to each other around the center of the block have shank segments (24) pressed into receiving apertures (18) in the bottom face. Fingers (26) of the terminals extend around the edge of the block to hold the crystal spaced from, and closely adjacent to the top face by supporting it at a perimeter portion on a step-shaped crystal support segment (36) of the finger. A segment (30) of the fingers adjacent and parallel to the bottom face is adapted for conductive attachment to a circuit.

11 Claims, 4 Drawing Figures

ELECTRONIC OSCILLATOR CRYSTAL WAFER MOUNT ASSEMBLY

TECHNICAL FIELD

The invention relates to a mounting arrangement for a crystal of a crystal oscillator, particularly one using a crystal in the shape of a thin wafer.

BACKGROUND OF THE INVENTION

Electronic crystal oscillators are widely used as clock pulse sources for various electronic circuits. The crystal of such an oscillator is a piezoelectric material precisely dimensioned in a configuration in which it may be caused to oscillate at its natural frequency by the application of a driving voltage pulse. For some applications the crystal may be in the shape of a rod, typically having either a round or a square cross-section. For other applications, it may be in the shape of a thin wafer. Regardless of the particular shape, the crystal must be held in a manner which permits it to vibrate freely in its natural frequency mode, while at the same time providing support for it and electrical connections to its electrodes.

An oscillator crystal which is of the thin wafer type has an electrode layer on each face. It must be held in such a manner that it may freely vibrate in the drumhead mode. This is usually accomplished by suspending the wafer between the ends of two resilient metal terminals arching upwards from the edges of a circuit. An edge contact area of the wafer is soldered or otherwise conductively bonded to the end of each of the terminals at diametrically opposed perimeter locations. The structure then has its natural frequency tuned to a predetermined value by the addition of a layer of tuning material in its central region. The layer of tuning material may be in the form of added thickness evaporated on the central region of an electrode layer.

The attachement of a crystal wafer to a circuit and its subsequent tuning is a delicate manual operation which is relatively costly. Different diameter wafers suitable for different requirements generally call for corresponding adaptations in the mounting hardware. A low profile, rugged structure is desireable. Imprecise location of the wafer on the circuit requires individual alignment of the tuning layer applications equipment for each assembly process. Excessive stress at the joint between the terminals and the wafer can lead to stress fracturing, either as a result of handling or from excessive sympathetic oscillations of the terminals themselves.

There is therefore a need for an improved mounting assembly for the crystal wafer of electronic crystal oscillators.

SUMMARY OF THE INVENTION

The novel crystal mounting assembly in accordance with the present invention includes an insulating mounting block which holds a plurality of resilient fingers extending from its bottom face, around its edge to hold the crystal closely adjacent to the top face. This arrangement permits different terminals, which are preformed for a particular crystal size, to be held in a single mounting block. The parts are specially suited for accurate automatic assembly to result in a reliable, rugged structure with a low profile.

DETAILED DESCRIPTION

Figure 1:
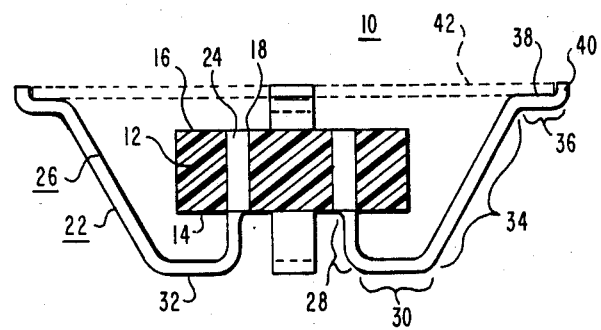
FIG. 1 is a partially sectioned front view of a crystal mounting assembly in accordance with one example of a preferred embodiment of the present invention.
Figure 2:
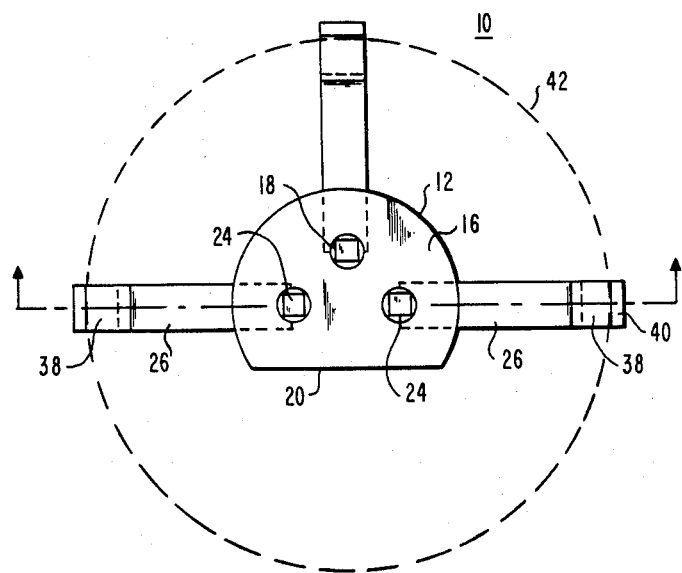
FIG. 2 is a top plan view of the assembly of FIG. 1.

The crystal mount assembly 10 shown in FIGS. 1 and 2 includes an insulating material crystal mounting block 12 having a bottom face 14 and a top face 16. Three receiving apertures 18 extend into the bottom face 14, perpendicularly through to the top face 16. They are radially spaced at 90 degrees with respect to each other about the center of the mounting block 12. A portion of the perimeter of the mounting block 12 is provided with a keyed surface 20 for facilitating the orientation of the mounting block 12 by automatic assembly equipment. The mounting block 12 is preferably made of a plastic material which is capable of withstanding soldering temperatures and which does not significantly outgas under heated conditions. Such outgassing can lead to contamination of a crystal held by the assembly 10. One example of a material suitable for the mounting block 12 is diallyl phthalate. It is advisable even for this material, that it be outgassed by heating for a period of time before becoming associated with a crystal wafer.

Three terminals 22 are assembled to the mounting block 12 by press-fitting their supporting shank segments 24 into the respective, round receiving apertures 18. The terminals 22 are formed from square cross-section phospor-bronze wire which is gold plated. Extending from the shank 24 is a resilient finger 26 which is swaged to have a flat cross section for greater resiliency. The finger 26 includes a shank extension segment 28 which extends a short distance perpendicularly from the bottom face 14 of the block 12. A circuit contact segment 30 bent at right angles to the extension 28 presents a circuit contact surface 32 for conductive attachment, such as by soldering, to a conductive contact area of an oscillator circuit, not shown. From the contact segment 30 a resilient stress relief segment 34 extends upward past the edge of the block 12 to above the top face 16, where the finger 26 ends with a step-shaped support segment 36 presenting a support surface 38 bounded toward the outside by a confinement stop 40.

A round wafer crystal 42 shown in phantom lines is held in the assembly 10 at three points near its perimeter on the support surfaces 38 and attached to them by a conductive bond through conducting epoxy adhesive to a pair of electrodes disposed on opposite faces of the crystal 42.

Figure 3:
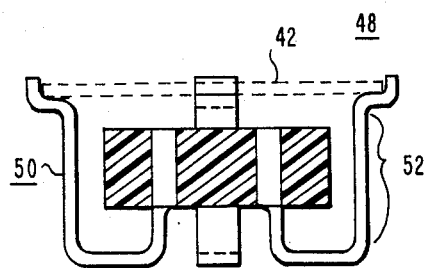
FIG. 3 is a partially sectioned front view of a crystal mounting assembly of the type shown in FIG. 1 provided with differently configured terminals for accepting a smaller size crystal.
Figure 4:
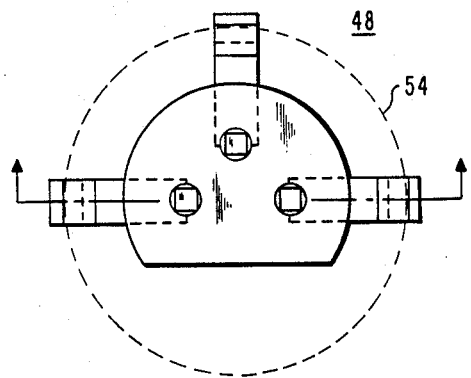
FIG. 4 is a top plan view of the assembly of FIG. 3.

The FIGS. 3 and 4 show another example of a mounting assembly 48 in which the block 12 is identical to that of the assembly 10 of FIG. 1, but in which the terminals 50 have a modified configuration of the stress relief segment 34, so that a smaller diameter crystal 54 may be mounted on the assembly 48.

The crystal mounting assemblies 10,48 in accordance with the invention have a number of advantageous features. Since both the terminals and the mounting block are parts which may be entirely preformed and readily assembled with automated machinery, there is a resulting reduction in cost and an improvement in the reliability, due to better precision in relative orientation of parts which is inherent to automatic assembly procedures. The assembly provides a uniform footprint of its contact surfaces for any size of wafer crystal carried by it. Different sizes of wafers may be accommodated by changing the configuration of only one part design, that of the terminal. The crystal wafers are held securely in a plane defined by the three support surfaces at the ends of the fingers and are held as closely adjacent the top surface of the block as is feasible without having the top face interfere with the oscillation of the crystal. Yet, the stress relief segments of the fingers have ready resilience in a direction roughly in the plane of the crystal, so that excessive stress on the perimeter of the crystal which might lead to fracturing there is avoided. Since the resilient segments do not extend for any appreciable distance in a direction generally parallel to the plane of the crystal, spurious vibration of the resilient segments which might lead to stress fracture of the crystal is avoided.

The ruggedness of the assembly makes it feasible to attach it and its crystal to a circuit while the circuit is still part of a larger substrate, before the operation of scribing and snapping of the substrate into individual circuits. Such a procedure has a significant cost advantage over one involving handling individual circuits after scribing and snapping.

The profile of the entire assembly is low. Precise preforming of the terminals facilitates precise centering of the crystal when it is placed on it, thus facilitating the deposition of a layer of frequency tuning material in its center area without individual alignment of the tuning equipment.

While in the embodiments described above, the terminals are radially spaced with respect to each other at 90 degree angles, other radial spacing may also be used as desired. The 90 degree spacing is convenient for accommodating both round and square wafer crystals.

The receiving apertures in the mounting block may extend entirely through the block or just partly through it. They may also extend at a non-perpendicular angle to the bottom face of the block.

It is entirely feasible for the mounting block to have more than three terminals. For that matter, under some circumstances two terminals might also suffice.

What is claimed is:

1. A mounting assembly for an electronic oscillator crystal, comprising:

a mounting block of electrically insulating material having a bottom face, a top face, and an edge, said block being provided with at least two receiving apertures extending into its bulk from its bottom face;

a plurality of conductive terminals, each comprising a shank segment which is inserted and firmly held in one of said apertures, and a resilient supporting finger which extends from said shank at said bottom face around said outer edge to said top face and is adapted at its end to support the perimeter area of a wafer crystal in a position closely adjacent said top face of said block.

2. The assembly defined in claim 1, wherein said finger comprises:

a circuit contact segment extending generally parallel to said bottom face of said block and including a contact surface for attachment to a circuit, and a stress relief segment extending from said contact segment, said stress relief segment being terminated by an end segment.

3. The assembly defined in claim 2, wherein said end segment of said finger is step-shaped and comprises a crystal support segment generally parallel to said top face of said block and a confinement segment extending away from said top face of said block at the end of said support segment for determining the radial placement of a crystal wafer on said support segment.

4. The assembly defined in claim 3 wherein said terminals are oriented in relation to each other with a radial spacing of 90°0 about the center of said block.

5. The assembly defined in claim 4 wherein said finger is a flattened wire.

6. The assembly defined in claim 5 wherein said block comprises a keyed perimeter portion for facilitating orientation in assembly.

7. The assembly defined in claim 6 wherein said shank segments are held in said apertures by interference fit.

8. The assembly defined in claim 7 wherein said shank segments have a square cross-section and said fingers are swaged.

9. The assembly defined in claim 8 wherein said block is made of a plastic material which exhibits a minimum of outgassing.

10. The assembly defined in claim 9 wherein said block is made of diallyl phthalate.

11. The assembly defined in claim 10 wherein said terminals are made of plated phosphor-bronze.

* * * * *